(12) United States Patent
Tam

(10) Patent No.: US 6,600,349 B2
(45) Date of Patent: Jul. 29, 2003

(54) WAVEFORM GENERATOR, DISPLAY DEVICE AND ELECTRONIC APPARATUS

(75) Inventor: Simon Tam, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/962,209

(22) Filed: Sep. 26, 2001

(65) Prior Publication Data

US 2002/0036523 A1 Mar. 28, 2002

(30) Foreign Application Priority Data

Sep. 28, 2000 (GB) .............................. 0023788

(51) Int. Cl.[7] ................................ H03K 4/06
(52) U.S. Cl. ...................... 327/131; 327/124
(58) Field of Search ............... 327/131, 124, 327/137, 134, 136, 140, 94, 95, 96

(56) References Cited

U.S. PATENT DOCUMENTS 4,859,872 A * 8/1989 Hyakutake ................. 327/131
5,144,160 A * 9/1992 Lee et al. .................. 327/361
5,689,201 A * 11/1997 Temes et al. ................ 327/95
5,942,856 A * 8/1999 Koyama .................. 315/169.2
6,184,726 B1 * 2/2001 Haeberli et al. ............. 327/307

FOREIGN PATENT DOCUMENTS

| GB | 2198305 | 2/1989 |
| JP | A 59216320 | 12/1984 |

* cited by examiner

Primary Examiner—Timothy P. Callahan
Assistant Examiner—Linh Nguyen
(74) Attorney, Agent, or Firm—Oliff & Berridge, PLC

(57) ABSTRACT

A waveform generator comprising an input terminal connected to one terminal of a first capacitor, a first switch connecting the other terminal of the first capacitor to one terminal of a second capacitor, a second switch connected for operatively discharging the second capacitor, the said one terminal of the second capacitor also being connected to the input of a buffer the output of which is connected to the output of the generator, and a third switch connected so as operatively to feed back the output of the buffer to the other terminal of the first capacitor. The generator can be implemented using polysilicon TFTs. The invention also relates to a display device and to electronic apparatus which include at least one of the described waveform generators.

16 Claims, 8 Drawing Sheets

WAVEFORM GENERATOR, DISPLAY DEVICE AND ELECTRONIC APPARATUS

The present invention relates to a waveform generator particularly of the type which is suitable for the generation of sawtooth and/or triangular waveforms. The present invention also relates to a display device and to electronic apparatus.

Sawtooth and triangular waveform signals are used in many analog electronic circuits, including for example circuits providing pulse width modulation (PWM) and in analog-to-digital converters.

According to the present invention there is provided a waveform generator comprising an input terminal connected to one terminal of a first capacitor, a first switch connecting the other terminal of the first capacitor to one terminal of a second capacitor, a second switch connected for operatively discharging the second capacitor, the said one terminal of the second capacitor also being connected to she input of a buffer the output of which is connected to the output of the generator, and a third switch connected so as operatively to feed back the output of the buffer to the other terminal of the first capacitor.

Known circuits for generating sawtooth and/or triangular waveforms are based on single crystal MOSFET devices and have not been implemented using thin film transistors (Ms) due to problems incurred by TFT characteristics. It is an advantage of the present invention that the waveform generator can be implemented using TFTs.

The so-called kink effect experienced with TFT transistors and their lack of good saturation output characteristics are particular examples of the problems which have prevented the prior use of TFTs in waveform generator circuits.

Unlike the output characteristics ($I_D$-$V_{DS}$) of single crystal MOSFETs, with polycrystaline silicon TFTs a saturation regime is not observed. Instead when the device is operating above the so-called pinch-off level, generally when $V_{DS}$>$V_{GS}$, high electric fields are formed near the drain and this results in so-called impact ionisation. The result is an increase in drain current $I_D$ and it is this which is referred to as the kink effect. This effect increases power dissipation and degrades the switching characteristics in digital circuits, whilst reducing the maximum obtainable gain as well as the common mode rejection ratio in analogue circuits.

An embodiment of the present invention will now be described in more detail by way of further example only and with reference to the accompanying drawings, in which:

FIG. 1 is a block circuit diagram illustrating one example of use of an integrated waveform generator;

FIGS. 2(a) and (b) illustrate sawtooth and triangular waveforms, respectively, such as might be used in the circuit illustrated in FIG. 1:

Before describing the detailed circuit of the waveform generator, an example will be given of one of the many uses of the waveform generator. Thus, FIG. 1 illustrates a waveform generator used in a matrix display device, As shown, the waveform generator receives three input signals ($V_{scan}$, $V_{ref}$, $V_{master}$) and outputs a signal, $V_{saw}$, which is used to drive a row of pixels in the matrix display.

The precise timing and data voltage relationship becomes a major challenge when the spatial variation of TFT characteristics over a display panel is taken into account. However, this problem can be solved by providing the master clock $V_{master}$ and the reference voltage source $V_{ref}$ to ensure that outputs from all waveform generators in the matrix are the same but different in phase shift.

The signal $V_{saw}$ is input to pixel level circuitry which applies a series of uses, $V_{pulse}$, to the light emitting element of the pixel. Signal $V_{saw}$ controls the width of the pulses, such that pulse width modulated driving of the display matrix is obtained.

Figure 1:
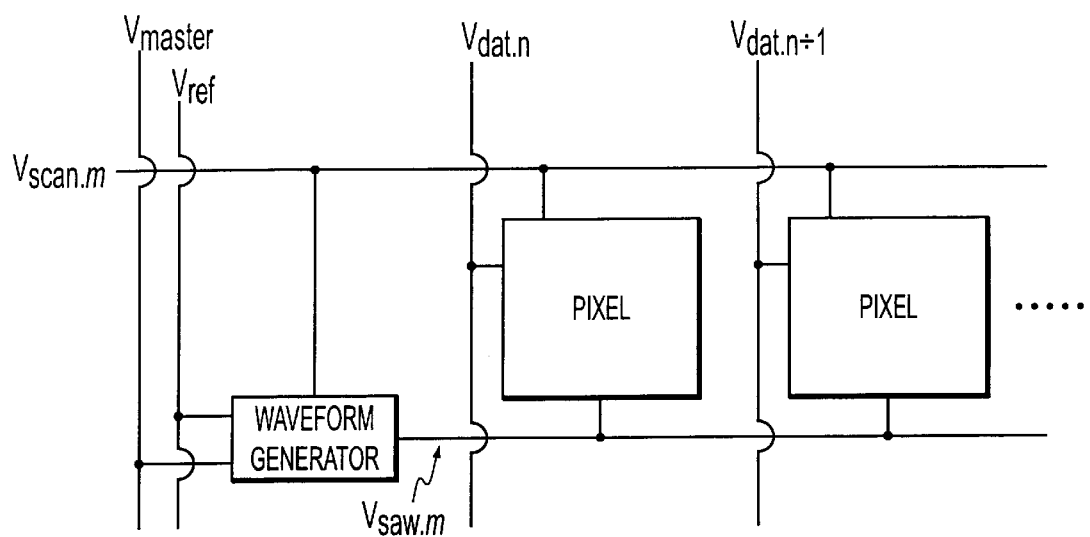

From FIG. 1 it will be apparent that console benefits can be achieved if the waveform generator can be implemented using TFTs. For example, the waveform generator can be integrated with the pixels on a single substrate. This can facilitate fabrication, reduce size, improve reliability and reduce cost. The number of interconnections required can be reduced by using such an integrated waveform generator and high switching speed can be obtained.

Figure 2A:
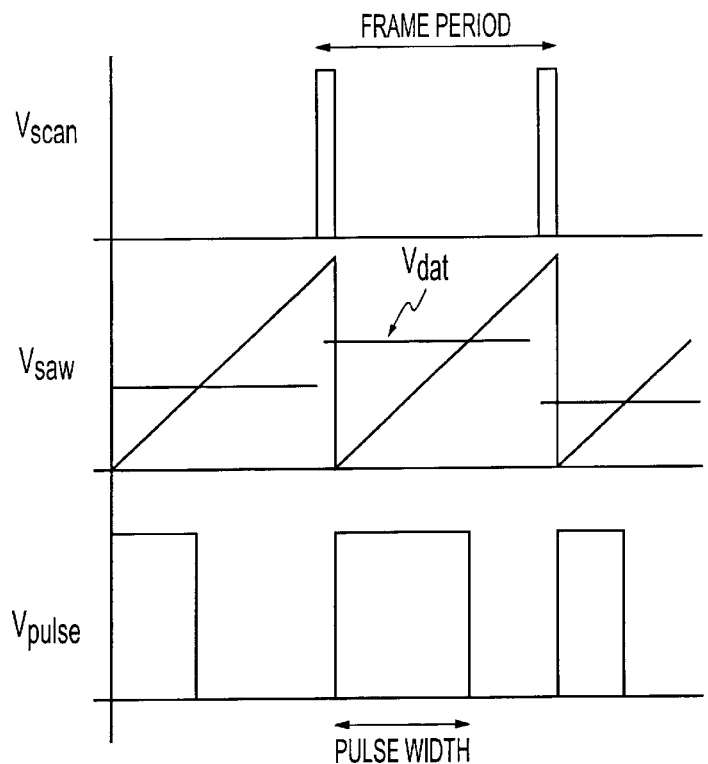
Figure 2B:
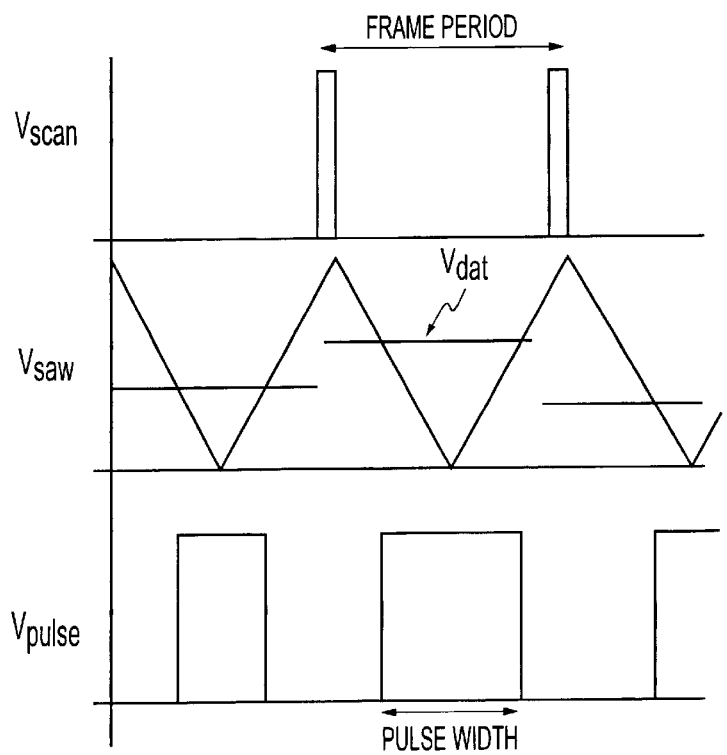

FIG. 2 comprise two diagrams, (a) and (b), in which the waveforms $V_{scan}$, $V_{saw}$ and $V_{pulse}$ are shown. This illustrates an example of the different effects which can be achieved by varying the shape of the waveform output by the generator. In FIG. 2(a) the waveform of $V_{saw}$ is a sawtooth whereas in FIG. 2(b) the waveform of $V_{saw}$ is triangular. Using the sawtooth waveform of FIG. 2(a) the output pulse always starts at the beginning of each frame. In contrast, with the triangular waveform of FIG. 2(b), the centre of the output pulse always occurs at mid-cycle.

Figure 3:
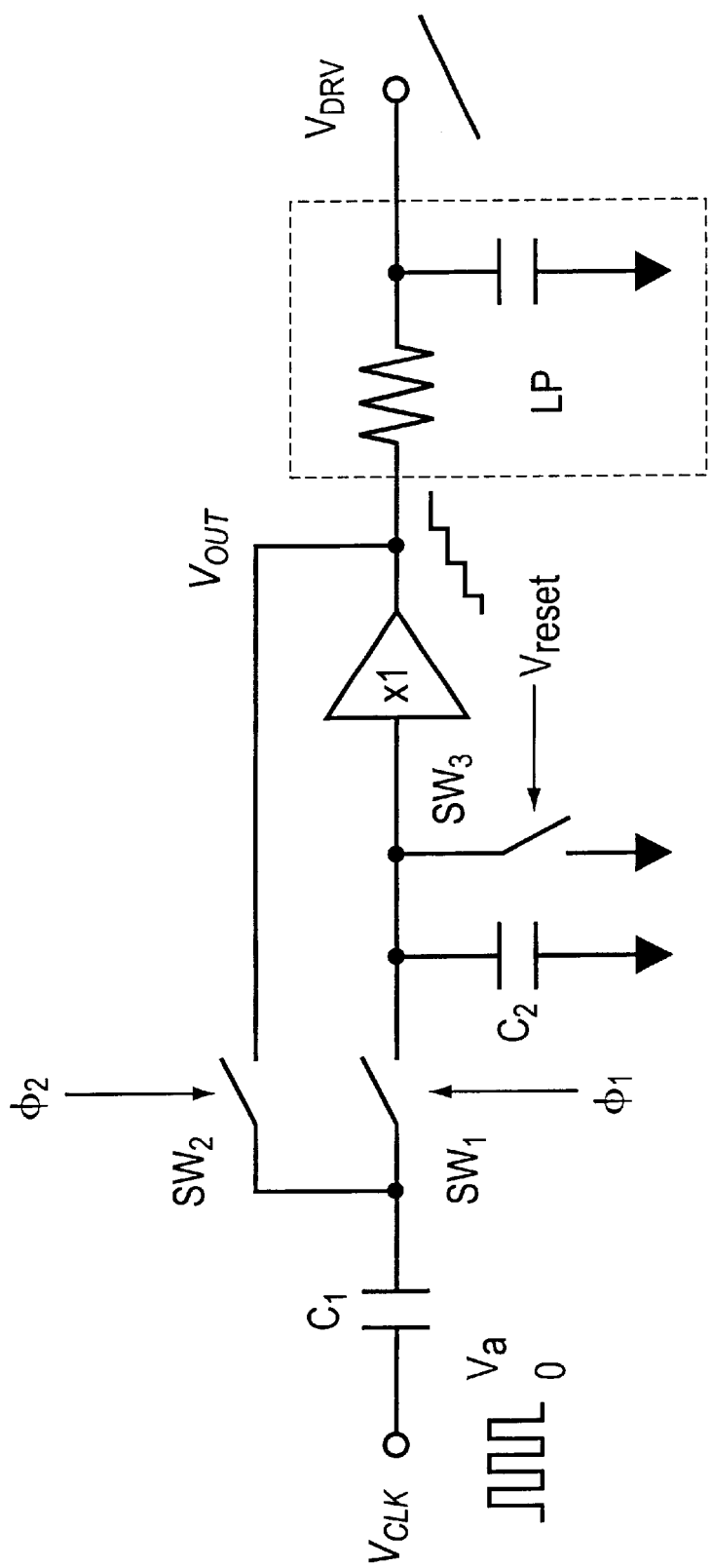
FIG. 3 is a detailed circuit diagram of a waveform generator constituting an embodiment of the present invention.

FIG. 3 is a circuit diagram of a sawtooth waveform according to one embodiment of the present invention. The circuit receives an input signal $V_{CLK}$ which is applied to one terminal of a capacitor $C_1$. The other terminal of capacitor $C_1$ is connected to one side of each of switches $SW_1$ and $SW_2$. These switches $SW_1$ and $SW_2$ are controlled by signals $\phi_1$ and $\phi_2$, respectively. The other side of switch $SW_1$ is connected to ground via a capacitor $C_2$ and also via a switch $SW_3$ which is controlled by signal $V_{reset}$. Switches $SW_1$, $SW_3$ and capacitor $C_2$ are connected to the input of a unity gain buffer (x1). Switch $SW_2$ controls a feedback loop from the output, $V_{out}$ of the buffer. The output of the buffer is applied to a low-pass filter L.P. consisting of a resistor and a capacitor. The output of the filter L.P. provides the generator output $V_{DRV}$.

Implementing the switches with CMOS technology enables so-called "feed-through", i.e. coupling with other circuit voltages, to be avoid. Generally, the circuit is implemented using polysilicon TFT technology—for example, as illustrated in FIG. 5

Figure 4:
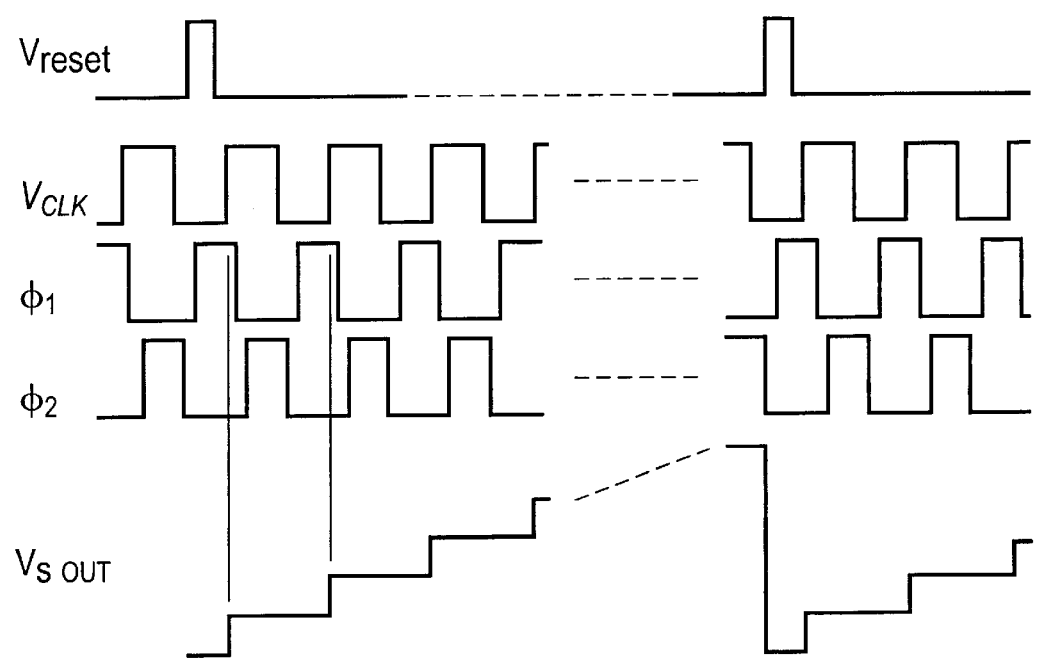
FIG. 4 shows input and output signals for the circuit of FIG. 3.

As noted above, the circuit has four input signals ($V_{CLK}$, $\phi_1$, $\phi_2$ and $V_{reset}$) and one output signal ($V_{DRV}$). These signals are shown in FIG. 4.

Waveform $V_{CLK}$ operates between 0V and a maximum level, say h. Waveforms $\phi_1$ and $\phi_2$ are non-overlapping clock pulses. When $V_{reset}$ goes high switch $SW_3$ closes so that the input of the unity gain buffer is at 0V and $C_2$ is discharged. Effectively, this acts as a reset and zeros the output. When $V_{reset}$ goes low, switch $SW_3$ is opened. Waveform $V_{CLK}$=0V when $SW_1$ is closed and $SW_2$ is opened. The transition of $V_{CLK}$ from 0V to h raises the input voltage at the unit gain buffer. If $C_1=C_2$, this increment equals h/2. When $V_{CLK}$=h, $SW_1$ is opened and $SW_2$ is closed. The unity gain buffer input voltage is stored by $C_2$. This voltage is reflected by the output of the unity gain buffer and is connected to $C_1$ while $V_{CLK}$ returns to 0V. Next $SW_2$ is opened and then $SW_1$ is closed, and then $V_{CLK}$ will transit from 0V to h. This will increase further the voltage at the input of the unity gain buffer. If $C_1=C_2$, this increment equals h/2 and the resulting voltage becomes h. This continues and the output of the unity pin buffer takes on a step shape. If the output is passed trough the low pass filter L.P., the output signal becomes a smooth ramp.

Figure 5:
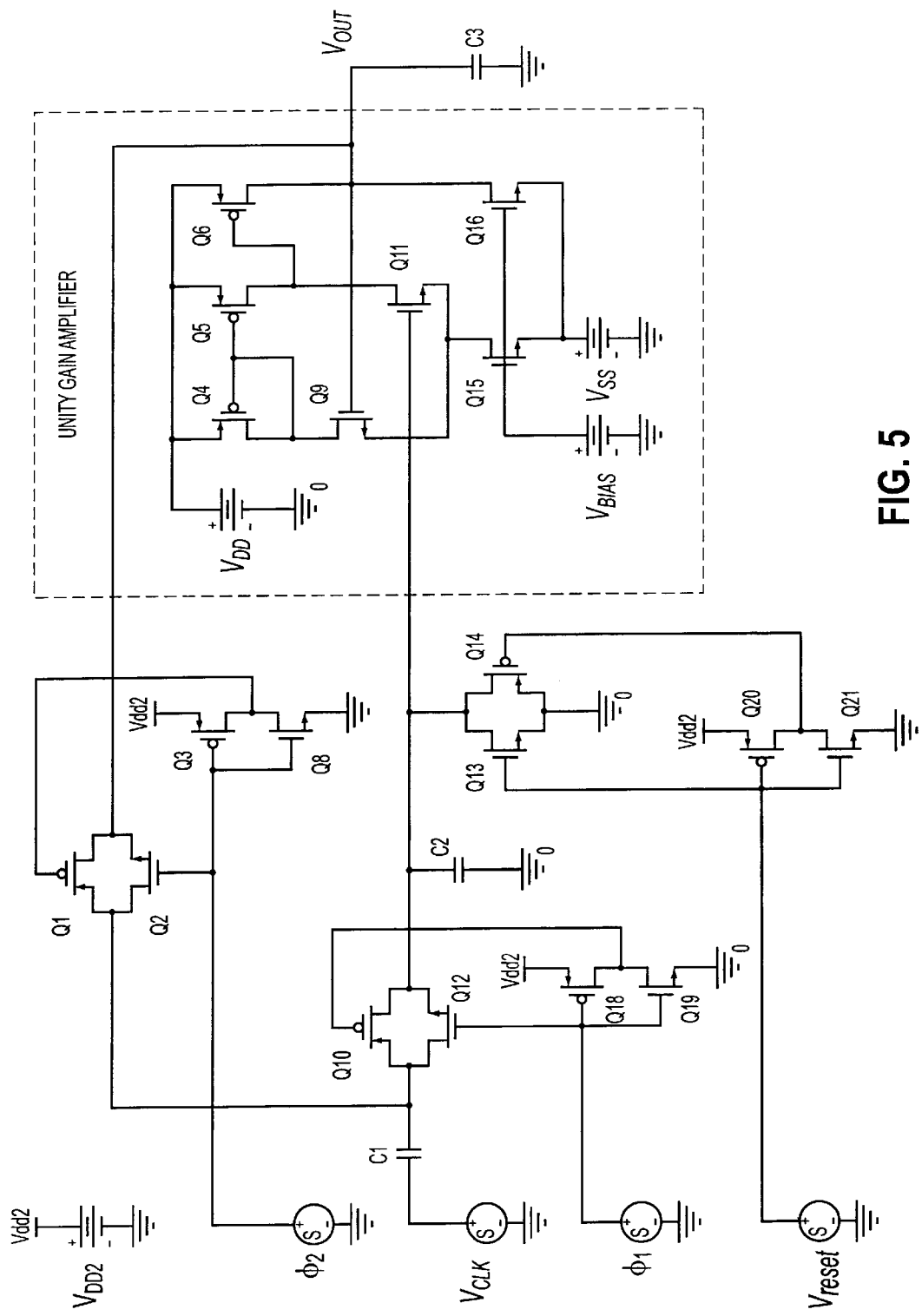
FIG. 5 shows the detail of the circuit of FIG. 3 implemented using TFT transistors.

FIG. 5 shows the detail of the circuit of FIG. 3 implemented using TFT transistors. Switch $SW_1$ is implemented by the complementary CMOS transistors Q10 and Q12. Switch $SW_2$ is implemented by the complementary CMOS transistors Q1 and Q2. Switch $SW_3$ is implemented by the complementary CMOS transistors Q13 and Q1. Since these switches are implemented as complementary CMOS transistor pairs, in each case the respective input signal is applied to the N channel transistor through a respective inverter, That is, signal $\phi_1$ is input to transistor Q10 via the inverter circuit formed of transistors Q18 and Q19, Signal $\phi_2$ is input to transistor Q1 via the inverter circuit formed of transistors Q3 and Q8. Signal $V_{reset}$ is input to transistor Q14 via the inverter circuit formed of transistors Q20 and Q21. The unity gain amplifier/buffer is implemented as a simple amplifier circuit of the shown configuration using transistors Q4, Q5, Q6, Q9, Q11, Q15 and Q16. A capacitor $C_3$ is shown connected to $V_{out}$, in place of the low pass filter shown in FIG. 3.

The present invention can be used in small, mobile electronic products such as mobile phones, computers, CD players, DVD players and the like—although it is not limited thereto.

Several examples of electronic apparatuses using the present invention will now be described.

<1: Mobile Computer>

An example in which the present invention is applied to a mobile personal computer will now be described.

Figure 6:
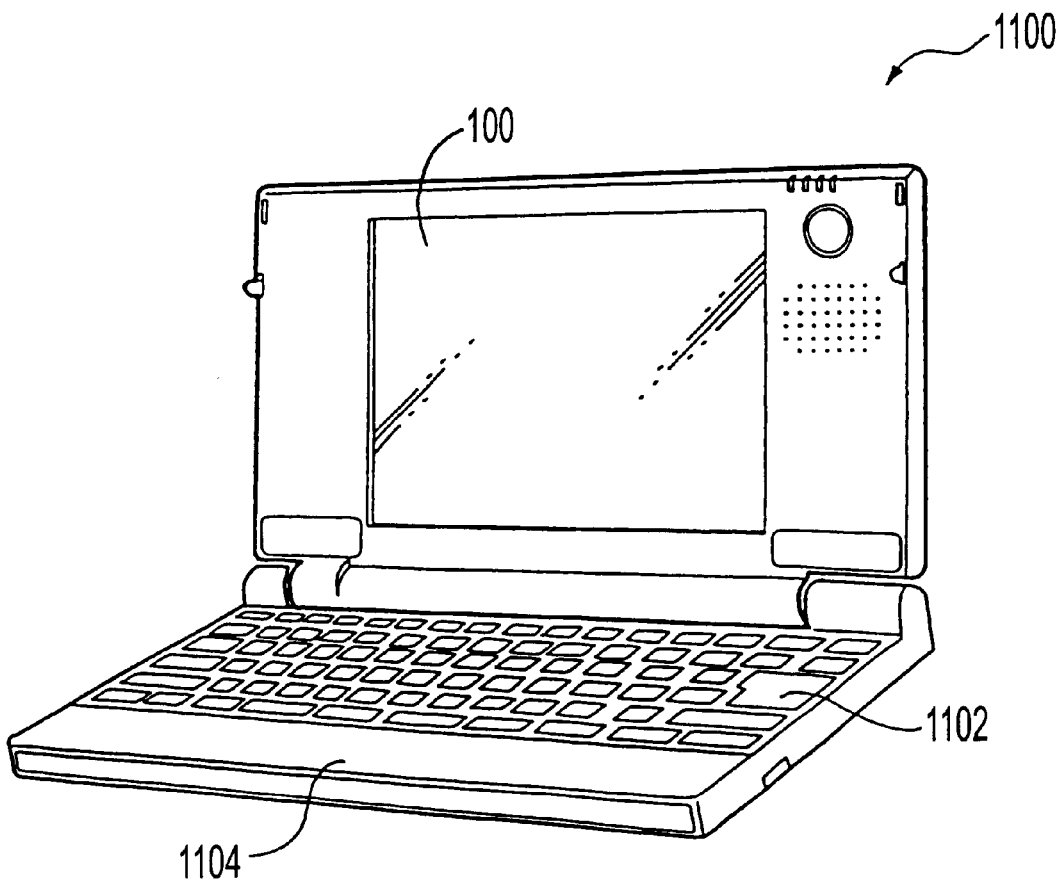
FIG. 6 is a schematic view of a mobile personal computer incorporating a waveform generator according to the present invention.

FIG. 6 is an isometric view illustrating the configuration of this personal computer. In the drawing, the personal computer 1100 is provided with a body 1104 including a keyboard 1102 and a display unit 1106. The display unit 1106 is implemented using a display panel which includes a waveform generator according to the present invention. A waveform generator according to the present invention could be used in components of the mobile computer other than the display, for example in analog-to-digital converters contained therein.

<2: Portable Phone>

Figure 7:
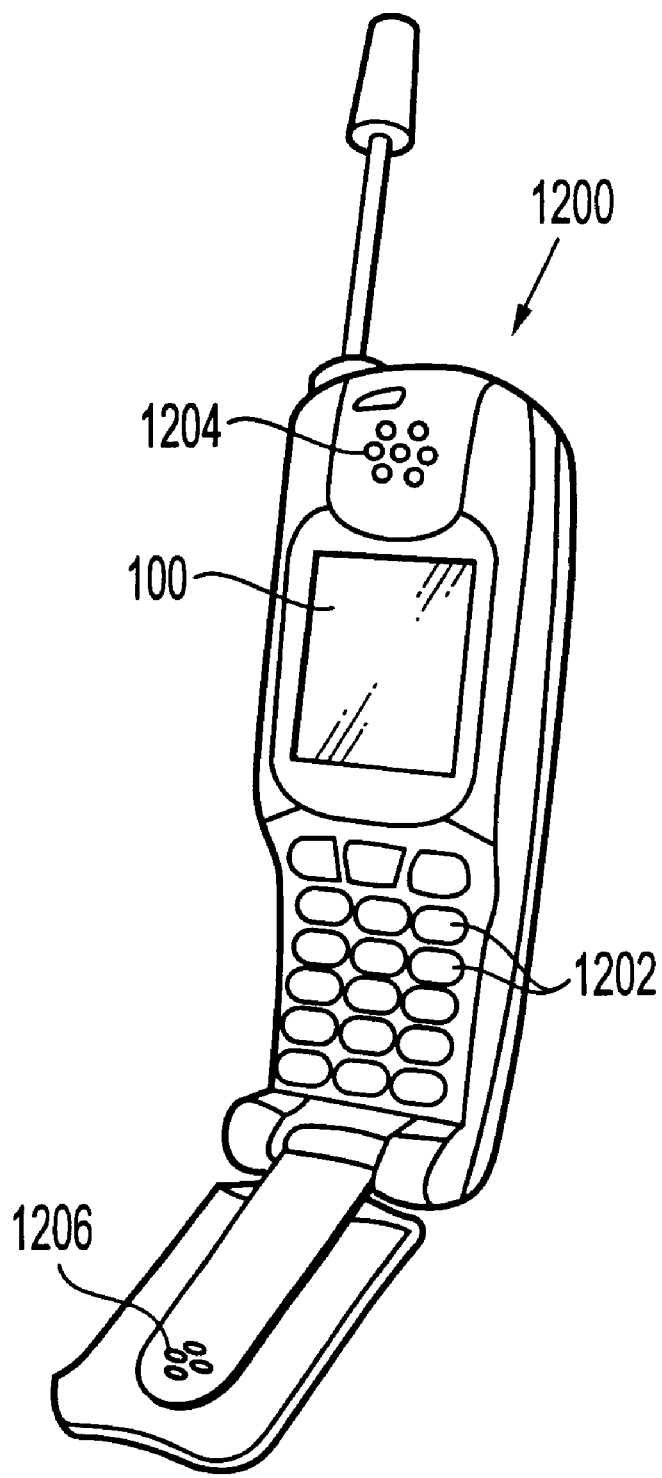
FIG. 7 is a schematic view of a mobile telephone incorporating a waveform generator according to the preset invention.

Next, an example in which a waveform generator according to the present invention is applied to a display section of a portable phone will be described. FIG. 7 is an isometric view illustrating the configuration of the portable phone, In the drawing, the portable phone 1200 is provided with a plurality of operation keys 1202, an earpiece 1204, a mouthpiece 1206, and a display panel 100. This display panel 100 includes a waveform generator according to the present invention. A waveform generator according to the present invention could be used in components of the portable phone other than the display, for example in analog-to-digital converters contained therein.

<3: Digital Still Camera>

Figure 8:
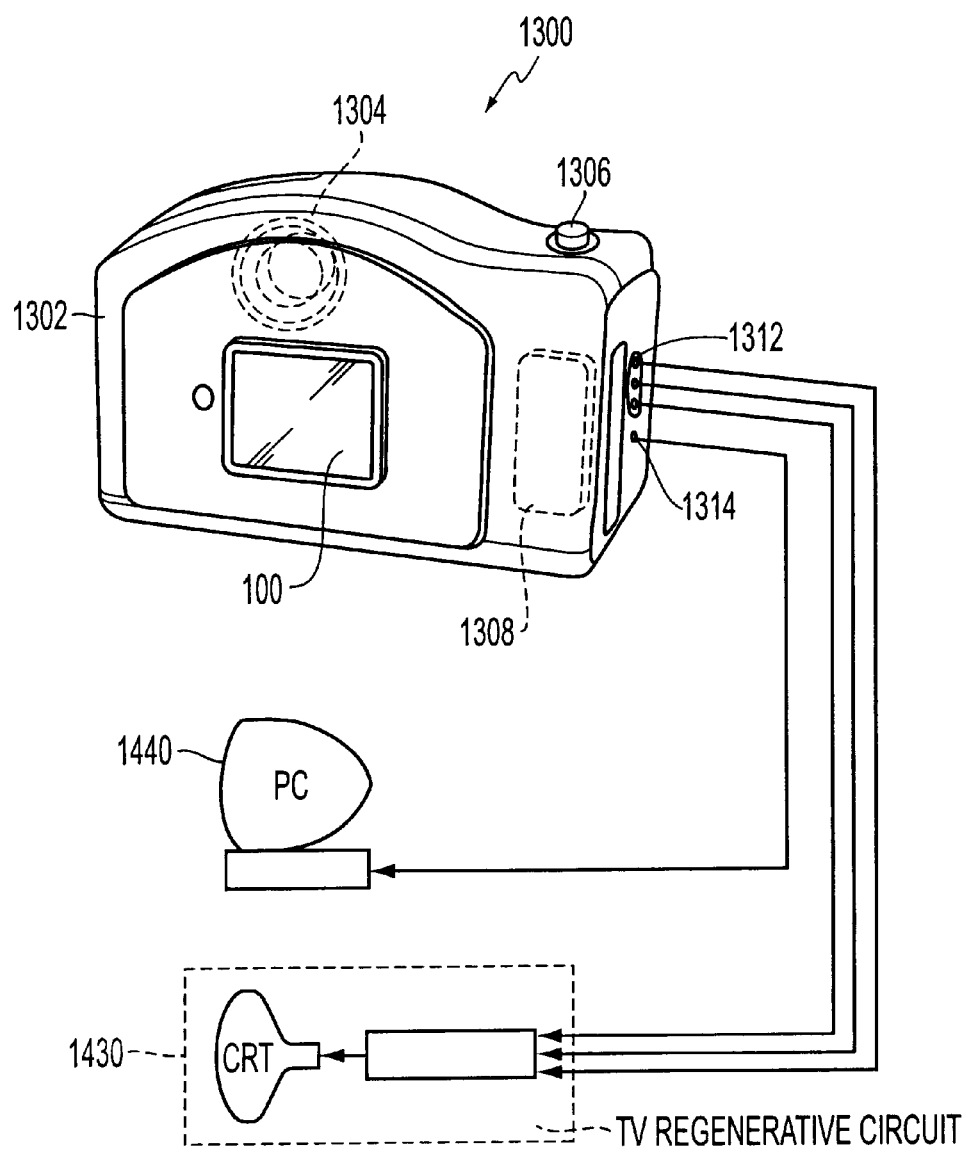
FIG. 8 is a schematic view of a digit camera incorporating a waveform generator according to the present invention.

Next, a digital still camera using an OEL display device 100, including a waveform generator according to the present invention, will be described. FIG. 8 is an isometric view illustrating the configuration of the digital still camera and the connection to external devices in brief.

Typical cameras sensitize films based on optical images from objects, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CC) is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

A waveform generator according to the present invention could be used in components of the digital still camera other than the finder display, for example in analog-to-digital converters contained therein.

Examples of electronic apparatuses, other than the personal computer shown in FIG. 6, the portable phone shown in FIG. 7, and the digital still camera shown in FIG. 8, include television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above described embodiments of the present invention can be applied to these electronic apparatuses.

Although the present invention has been described above mainly in relation to the benefits which can be achieved in relation to TFT technology, the invention is not limited thereto and other technologies can be used to implement the waveform generator of the present invention. The invention is applicable not only to thin film transistor technology but also to silicon based transistors. Silicon based transistors can be arranged on a display substrate using several different methods. For example, silicon based transistors can be arranged in a liquid.

What is claimed is:

1. A waveform generator comprising an input terminal connected to one terminal of a first capacitor, a first switch connecting the other terminal of the first capacitor to one terminal of a second capacitor, a second switch connected for operatively discharging the second capacitor, the said one terminal of the second capacitor also being connected to the input of a unity gain buffer, the output of which is connected to the output of the generator, and a third switch connected so as operatively to feed back the output of the unity gain buffer to the other terminal of the first capacitor.

2. A waveform generator as claimed in claim 1, wherein a low pass filter is connected between the output of the unity gain buffer and the output terminal of the generator.

3. A waveform generator as claimed in claim 1, wherein the switches are CMOS switches.

4. A waveform generator as claimed in claim 1, wherein the switches and the buffer are implemented by thin film transistors.

5. A waveform generator as claimed in claim 4, wherein the thin film transistors are formed of polysilicon.

6. A display device including at least one waveform generator comprising an input terminal of a first capacitor, a first switch connecting the other terminal of the first capacitor to one terminal of a second capacitor, a second switch connected for operatively discharging the second capacitor, the said one terminal of the second capacitor also being connected to the input of a unity gain buffer, the output of which is connected to the output of the generator, and a third switch connected so as operatively to feed back the output of the unity gain buffer to the other terminal of the first capacitor.

7. An electronic apparatus including at least one waveform generator comprising an input terminal of a first capacitor, a first switch connecting the other terminal of the first capacitor to one terminal of a second capacitor, a second switch connected for operatively discharging the second capacitor, the said one terminal of the second capacitor also being connected to the input of a unity gain buffer, the output of which is connected to the output of the generator, and a third switch connected so as operatively to feed back the output of the unity gain buffer to the other terminal of the first capacitor.

8. A waveform generator as claimed in claim 2, wherein the switches are CMOS switches.

9. A display device as claimed in claim 6, wherein a low pass filter is connected between the output of the unity gain buffer and the output of the generator.

10. A display device as claimed in claim 6, wherein the switches are CMOS switches.

11. A display device as claimed in claim 6, wherein the switches and the unity gain buffer are implemented by thin film transistors.

12. A display device as claimed in claim 11, wherein the thin film transistors are formed of polysilicon.

13. An electronic apparatus as claimed in claim 7, wherein a low pass filter is connected between the output of the unity gain buffer and the output of the generator.

14. An electronic apparatus as claimed in claim 7, wherein the switches are CMOS switches.

15. An electronic apparatus as claimed in claim 7, wherein the switches and the unity gain buffer are implemented by thin film transistors.

16. An electronic apparatus as claimed in claim 15, wherein the thin film transistors are formed of polysilicon.

* * * * *

UNITED STATES PATENT AND TRADEMARK OFFICE
CERTIFICATE OF CORRECTION

PATENT NO. : 6,600,349 B2
DATED : July 29, 2003
INVENTOR(S) : Simon Tam

It is certified that error appears in the above-identified patent and that said Letters Patent is hereby corrected as shown below:

Title page,
Item [30], Foreign Application Priority Data, replace "0023788" with -- 0023788.3 --.

Signed and Sealed this

Twenty-seventh Day of January, 2004

JON W. DUDAS
*Acting Director of the United States Patent and Trademark Office*